United States Patent [19]

Hersom et al.

[11] 4,184,211

[45] Jan. 15, 1980

[54] OUTPUT STAGE FOR SWITCHING REGULATED POWER SUPPLY

[75] Inventors: Wallace N. Hersom, Tustin; John E. Crum, Mission Viejo, both of Calif.

[73] Assignee: LH Research, Irvine, Calif.

[21] Appl. No.: 908,563

[22] Filed: May 23, 1978

[51] Int. Cl.² .............................................. H02M 7/06
[52] U.S. Cl. ..................................... 363/141; 363/126
[58] Field of Search ................. 307/150, 151; 323/48; 336/200, 222, 175; 363/22–25, 39, 44, 45, 53, 67, 69, 70, 114, 116, 125, 126, 141, 144, 146

[56] References Cited

U.S. PATENT DOCUMENTS

| 2,714,648 | 8/1955 | Blok et al. ....................... 336/222 X |
| 3,363,165 | 1/1968 | Wilkinson ........................... 323/48 X |
| 3,745,440 | 7/1973 | Lord .................................. 323/48 X |
| 4,020,411 | 4/1977 | Tsuboi et al. ....................... 363/44 X |
| 4,103,267 | 7/1978 | Olschewski ...................... 336/200 X |
| 4,106,087 | 8/1978 | Kawasaki ............................. 363/70 |

Primary Examiner—William M. Shoop

Attorney, Agent, or Firm—Knobbe, Martens, Olson, Hubbard & Bear

[57] ABSTRACT

An output stage for a switching regulated power supply including a step down toroidal core transformer and a full wave rectifier having a significantly increased power output and a small size. The increased power output and small size are achieved by reducing the length of the path through which electrical power must flow in the power supply, by a symmetrical arrangement of all electrical paths within the power supply, and by utilizing single turn secondary windings, each associated with a diode rectifier element. A first group of diodes are mounted on one heat sink and the other diodes are mounted on another heat sink, the two heat sinks being arranged in parallel coplanar relationship under a circuit board mounting the transformer. The single turn secondary windings are connected to the diodes at interfaces uniformly symmetrically positioned along the circumference of a circle concentric with and surrounding the toroidal core.

27 Claims, 6 Drawing Figures

OUTPUT STAGE FOR SWITCHING REGULATED POWER SUPPLY

BACKGROUND OF THE INVENTION

It has been well known in the art of power supplies for high speed computers to use a switching regulated power supply to convert power from a standard 110 volt alternating current to a precise low voltage, high direct current. Typically, such low voltages are 2 volts, 5 volts, 12 volts, or 15 volts and currents ranging up to 200 amps. As used in this specification, the term "switching power supply" refers to that general class of power supplies in which an alternating current source at one frequency, typically 60 Hertz, is converted to a regulated alternating current source at a much higher frequency, typically 20,000 Hertz. This high frequency voltage is stepped down in an output stage and the output rectified to a smooth direct current at the lower voltage.

Switching regulated power supplies are generally used to supply the bias voltage for digital computer solid state logic elements. These logic elements in the computer are typically transistor integrated circuit stages, which change state or switch in response to either a logic impulse from another logic element or in response to a transient signal having a voltage in excess of the switching threshold voltage of the transistor. Such accidental transients will cause a switching of the logic elements of the computer which will upset the operation and control of the logic elements. Such an occurrence could result in either a minor error in the operation of the computer or could result in a complete upset and breakdown of the operation of the computer. Thus, it is seen that if a power supply having a direct current output which contains ripples or transients or other noise is used as a power supply for a computer, the transients, ripples, or noise in the power will be transmitted to the logic elements and can cause the undesirable upset of the logic elements in the computer. Therefore, computer power supplies must have an extremely smooth direct current output completely free of transients or ripples which could cause logic breakdown in the computer. For this reason, power supplies having a smoother direct current output free of ripple or noise have been sought after in the art.

Miniaturization has long been a goal in the art of computer packaging. For this reason, the space restrictions for the associated power supplies for a computer have become increasingly stringent, creating a necessity for decreasing the size of power supplies used on computers.

Competition in the marketing of computers has led to a desire for computers with enhanced capabilities, requiring a greater number of logic elements. Such an increase in the number of logic elements increases the power required to run the computer having the enhanced capabilities. Thus, ways to increase the power capabilities of the power supply of a computer without necessitating an increase in the size of the power supply have been sought after.

Power supplies of the prior art have typically been plagued with two problems. First, the direct current output of such power supplies often has ripple or noise due to the long distances between output voltage buses. Secondly, such power supplies have been plagued by inefficient power output due to resistance losses caused by the long or non-uniform distances of electrical path lengths within the power supply.

SUMMARY OF THE INVENTION

These and other problems are alleviated in the output stage of a power supply for a computer of this invention which may have a 1,000 watt output but is packaged in the same sized case as competitive power supplies that provide only 600 to 750 watts. The features of this power supply output stage include the printed circuit board which mounts a toroidal transformer having one multiple turn primary winding connected to the regulated high frequency signal produced by a switching circuit and plural single turn secondary windings. In the specific preferred embodiment described herein, eight single turn windings are utilized. The secondary windings are U-shaped wires with their ends connected to conductive elements on the printed circuit board. Four of the secondary windings are connected at the outer periphery of the toroidal conductor to four respective diodes having their anodes connected to the opposite side of the printed circuit board and their cathodes connected to a heat sink. The remaining four secondary windings are connected along the outer periphery of the toroidal conductor by conductive elements on the circuit board to another four respective diodes having their cathodes mounted on the printed circuit board and their anodes connected to another heat sink. The two heat sinks are mounted in parallel coplanar relationship on the side of the printed circuit board opposite the toroidal transformer element.

Because four of the secondary windings are connected to the anodes of four diodes with their cathodes mounted to one heat sink and the other four secondary windings are connected to the cathodes of four diodes having their anodes mounted to another heat sink, the two heat sinks each have a sinusoidal half wave rectified voltage which is 180 degrees out of phase with the voltage of the other heat sink. Thus, by using one heat sink as the positive side of the power supply output and the other heat sink as the negative side of the power supply output, full wave rectification is achieved. A filter comprising a pair of series inductors and a parallel capacitor is used to smooth the full wave rectified sinusoidal output of the power supply to a direct current.

A significant feature of the invention is the uniformity of the path lengths between all electrical elements connected by the printed circuit board. Each of the secondary windings are identical and take the form of a U-shaped conductor. One end of each U-shaped conductor is connected to conductive elements on the printed circuit board along the circumference of an imaginary circle located interiorly of the toroidal transformer element. The other end of each of the U-shaped conductors is connected along an imaginary circle located exteriorly on the printed circuit board. Four of the diodes have their anodes and four have their cathodes connected to conductive elements on the printed circuit board and these conductive elements are, in turn, connected to the ends of the U-shaped conductors located exteriorly of the toroidal transformer element. This enables an arrangement of the conductive elements on the printed circuit board which assures completely uniform path lengths between all of the secondary windings and the heat sinks on the opposite side of the printed circuit board. As will be seen in the detailed description, these features facilitate the high density packaging design of the power supply of this invention.

The high density packaging involves close spacing of all electrical elements mounted on the printed circuit board, thereby reducing electrical path lengths.

The power supply of this invention also includes capacitive snubbing devices mounted in a novel arrangement. The snubbing devices are a resistor and a capacitor connected in series between the anode of a diode having its cathode connected to one heat sink and the cathode of another diode having its anode connected to the other heat sink. Because there are four forward mounted diodes having their cathodes connected to one heat sink and four reverse mounted diodes having their anodes connected to another heat sink in the power supply of this invention, there are four sets of snubbing devices connected between the four pairs of forward and reverse mounted diodes. The high density packaging method of this invention results in a novel and advantageous arrangement of the snubbing elements on the printed circuit board which results in a minimization of the electrical path lengths and a symmetrical configuration of the electrical path lengths of the snubber elements and the conductive elements on the printed circuit board.

DESCRIPTION OF THE PREFERRED EMBODIMENT

The Electrical Configuration of the Output Stage

Figure 1:
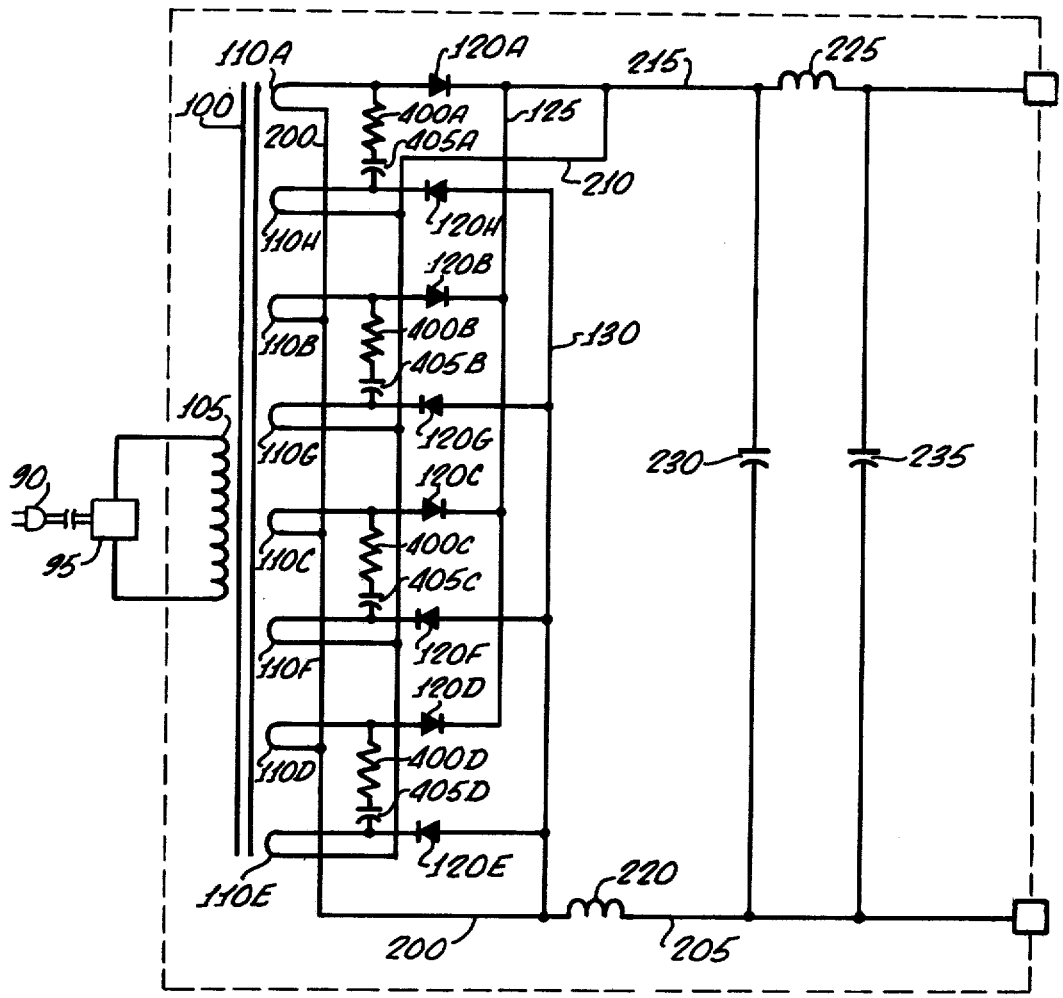
FIG. 1 is a schematic diagram of a preferred embodiment of an output stage for a switching regulated power supply constructed in accordance with this invention.

FIG. 1 shows a plug 90 adapted to be connected to an alternating current source having a frequency of 60 Hertz. The frequency is converted in a switching and voltage regulating circuit 95 to 20 KiloHertz. Regulated 20 KiloHertz alternating current flows through the primary winding 105 of the transformer core 100. The transformer core 100 has eight secondary windings, 110A, 110B, 110C, 110D, 110E, 110F, 110G, and 110H. For purposes of the schematic diagram of FIG. 3, all of the secondary windings 110A through 110H are considered as uniformly wound from top to bottom in clockwise fashion. The windings 110A, 110B, 110C, and 110D each have their top ends connected to the anodes of diodes 120A, 120B, 120C, and 120D, respectively. The diodes 120A, 120B, 120C, and 120D each have their cathodes connected to a conductive heat sink 125. The secondary windings 110E, 110F, 110G, and 110H have their top ends connected to the cathodes of diodes 120E, 120F, 120G, and 120H, respectively. The anodes of each of the diodes 120E, 120F, 120G, and 120H are all connected to another conductive heat sink 130. The heat sink 125 is connected to a positive output bus bar 215, while the heat sink 130 is connected to a negative output bus bar 205.

The windings 110A, 110B, 110C, and 110D each have their lower ends connected by the conductor 200 to the negative output bus bar 205. The secondary windings 110E, 110F, 110G, and 110H are connected at their lower ends to the conductor 210 which connects to the positive output bus bar 215. An inductor 220 is connected in series on the bus bar 205. An inductor 225 is connected in series on the bus bar 215. Electrolytic capacitors 230 and 235 are connected in parallel across the two output buses 205 and 215. The electrolytic capacitor 230 typically has a capacitance of 19,000 microfarads while the electrolytic capacitor 235 typically has a capacitance of 47,000 microfarads.

The Mechanical Assembly of the Output Stage and Packaging

Figure 5:
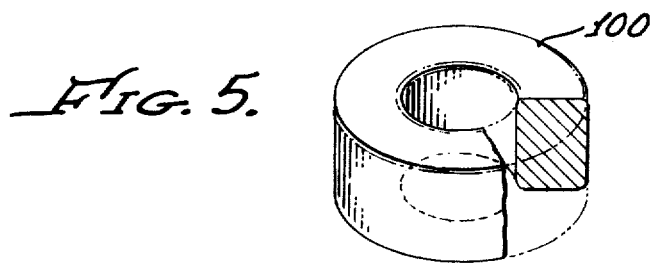
FIG. 5 is a perspective and partial cross-sectional view of the toroidal transformer core element of FIG. 2.
Figure 2:
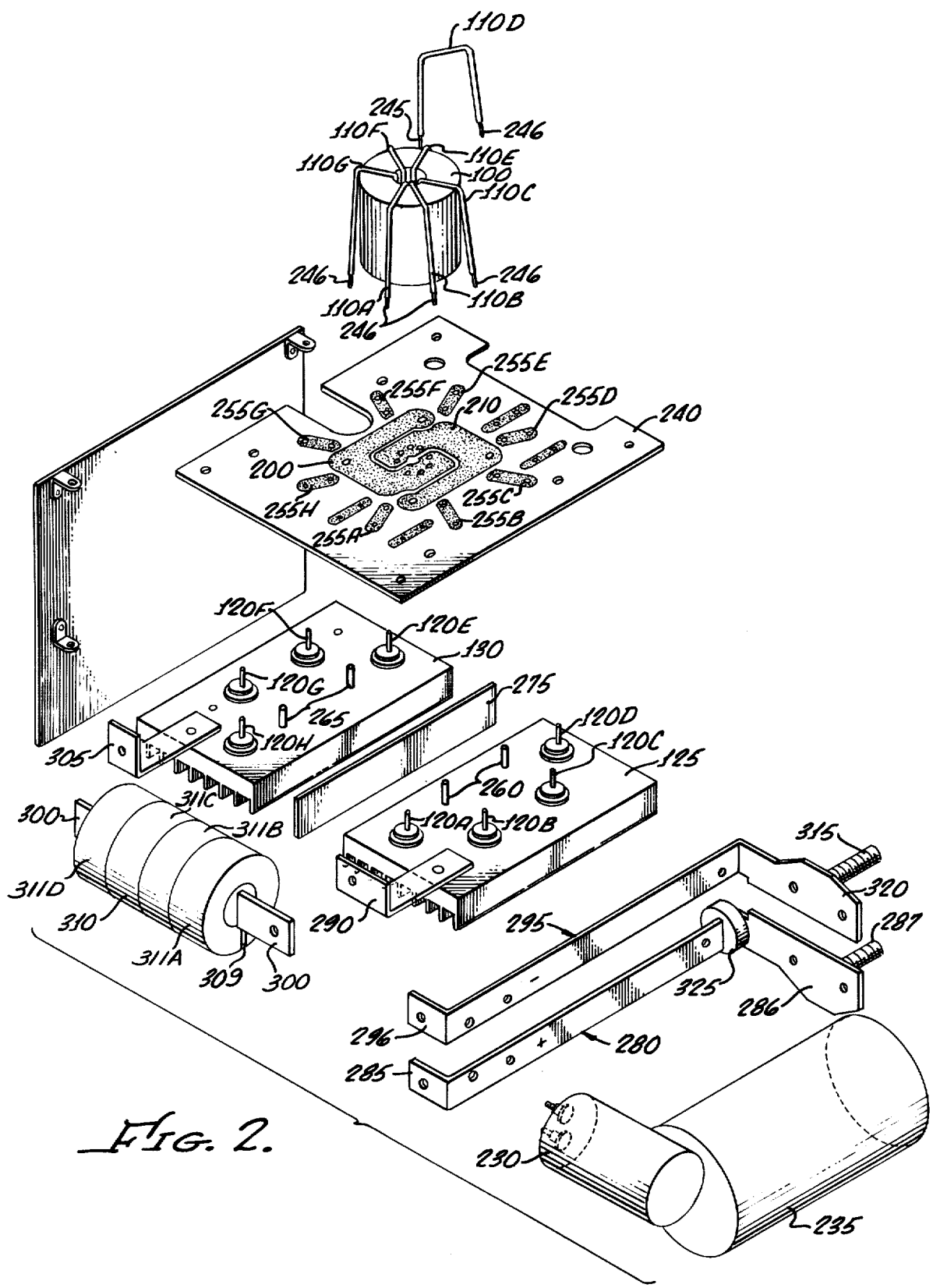
FIG. 2 is an exploded perspective view of the output stage for a switching regulated power supply of this invention showing the packaging of the components of the output stage.

FIG. 2 is an exploded perspective view of the power supply output stage of FIG. 1, but not including the primary winding 105 nor the switching circuit 95. FIG. 2 shows the toroidal transformer core 100 mounted on top of a circuit board 240. FIG. 5 shows the cross-sectional configuration of the core 100 more clearly. Two heat sinks 125 and 130 each are mounted in mutually parallel coplanar relationship on the bottom of the printed circuit board 240. The two heat sinks 125 and 130 mount the eight diodes, 120A through 120H, disposed between the heat sinks and the printed circuit board 240.

Secondary windings 110A, 110B, 110C, and 110D are advantageously identical, generally U-shaped wire conductors mounted over the toroidal transformer core 100 having their ends 245 disposed interiorly of the toroidal transformer core connected to a conductor 200 on the printed circuit board 240 along the circumference of an imaginary circle interior of and concentric with the toroidal core 100. The opposite ends 246 of each of the secondary windings 110A, 110B, 110C, and 110D, disposed exteriorly of the toroidal core 100, respectively, terminate in conductors 255A, 255B, 255C, and 255D, on the printed circuit board 240 along the circumference of an imaginary circle interior of and concentric with the toroidal core 100. The conductors 255A, 255B, 255C, and 255D are located above and connected to anodes of the diodes 120A, 120B, 120C, and 120D, respectively, mounted on the heat sink 125. The diodes 120A, 120B, 120C, and 120D, in turn, have their cathodes mechanically and electrically attached to the heat sink 125. The heat sink 125 is electrically connected by two cylindrical conductors 260 to the conductor 210 on the printed circuit board 240.

The conductor 210 connects to the remaining secondary windings 110E, 110F, 110G, and 110H at their ends 245, mounted on the printed circuit board 240 interiorly of the toroidal core 100. These windings are likewise advantageously generally U-shaped, identical in configuration to windings 110A–110D.

The ends 246 of the secondary U-shaped windings 110E, 110F, 110G, and 110H disposed exteriorly of the toroidal transformer coil 100 each terminates in conductive elements 255E, 255F, 255G, and 255H, respectively, on the printed circuit board 240. The conductive elements 255E, 255F, 255G, and 255H are located above and connected to the cathodes of the diodes 120E, 120F, 120G, and 120H, respectively, mounted on the heat sink 130. The anodes of the diodes 120E, 120F, 120G, and 120H are connected mechanically and electrically to the heat sink 130. The heat sink 130 has two cylindrical conductors 265 extending from the surface of the heat sink 130 facing the printed circuit board which are connected to the conductor 200 on the circuit board 240 (shown in FIG. 4). The conductor 200 is connected to the interior ends 245 of the secondary windings 110A, 110B, 110C, and 110D.

Figure 6:
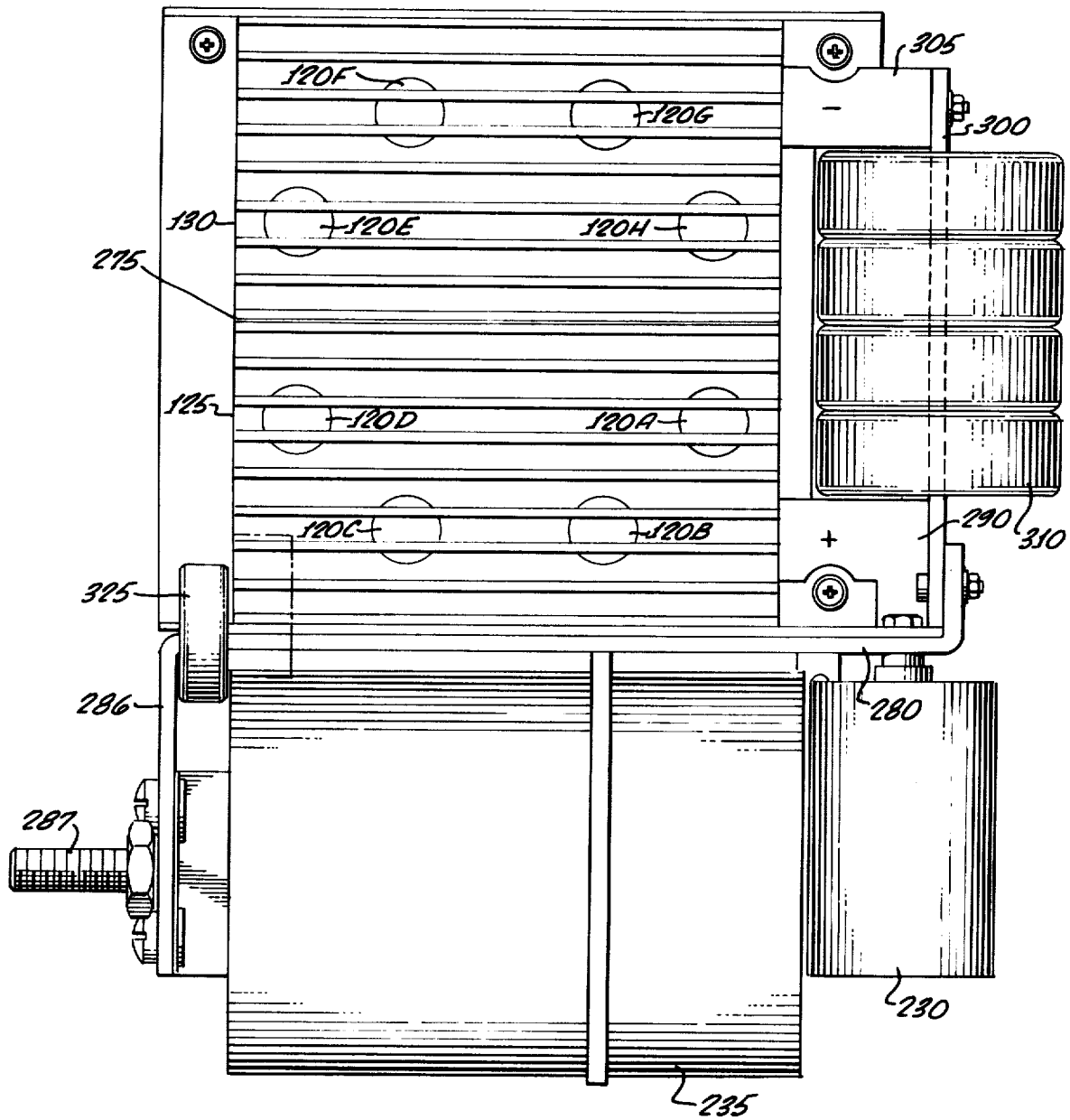
FIG. 6 is a bottom view of the power supply of this invention fully assembled.

As shown in FIG. 2, the heat sinks 125 and 130 have solid rectangular configurations having planar top surfaces on which the diodes 120A through 120H are mounted, and bottom surfaces having a plurality of heat dissipation fins extending therefrom. These fins and the circular arrangement of the diodes are best shown in FIG. 6. The two heat sinks are mounted onto the bottom of the printed circuit board 240 in parallel coplanar relationship to one another and in parallel coplanar relationship to the printed circuit board. An insulator 275 (shown in FIGS. 2 and 6) is disposed between the two facing edges of the heat sinks 125 and 130.

The Output Bus Bars of the Power Supply

A positive bus bar 280 (shown in FIGS. 2 and 6) attaches at its end face 285 to a positive bus bar bracket 290 which is, in turn, attached to the heat sink 125. From end face 285, the positive bus bar 280 extends the entire length of the heat sink to end face 286. A bolt 287 forms the positive output terminal disposed on the end face 286 of the positive bus bar 280.

A negative bus bar 295 connects to another negative bus bar 300 at the end face 296 of the negative bus bar 295 and at one end of the negative bus bar 300, while the other end of the negative bus bar 300 is connected to a negative bus bar bracket 305 which mechanically and electrically attaches to the heat sink 130.

The bus bars 280 and 295, the bus bar brackets 290 and 305, and the negative bus bar 300 are preferably formed of highly conductive metal such as aluminum and have a large enough cross-section to provide a very low resistance conductive path to electric current.

The negative output terminal of the power supply is a bolt 315 located on the end face 320 of the negative bus bar 295. The bolts 287 and 315 forming the output terminals of the power supply also advantageously mount the electrolytic capacitor 235. The electrolytic capacitor 230 is mounted near the end faces 296 and 285 of the bus bars 295 and 280, respectively. A large inductor 310 having a toroidal configuration is mounted upon the negative bus bar 300. This inductor 310 is preferably formed of ferromagnetic material which is symmetrically mounted on the middle of the bus bar 300. A smaller inductor 325 is mounted on the positive bus bar 295 adjacent and bonded to the end face 286. The smaller inductor 325 is also preferably formed of ferromagnetic material shaped in a cylindrical disc configuration with its cylindrical axis parallel with the major portion of the positive bus bar 295.

The inductor 310, shown in FIG. 2, has an air gap 309. The inductor is formed from four toroidal ferrite members 311A, 311B, 311C, and 311D. Each of the toroidal members has an air gap 309 which is aligned with the air gap of the other toroidal members. The purpose of the air gap is to prevent saturation of the inductor 310.

As shown in FIG. 2, the air gap 309 extends through the lower half portion only of the inductor 310. In an alternative embodiment of this invention (not shown), the air gap 309 extends completely through both the upper and lower half portions of the inductor 310. In this embodiment, the inductor 310 may have two toroidal members, each formed from two separate facing C sections or C ferrite cores.

Design of the Printed Circuit Board

Figure 3:
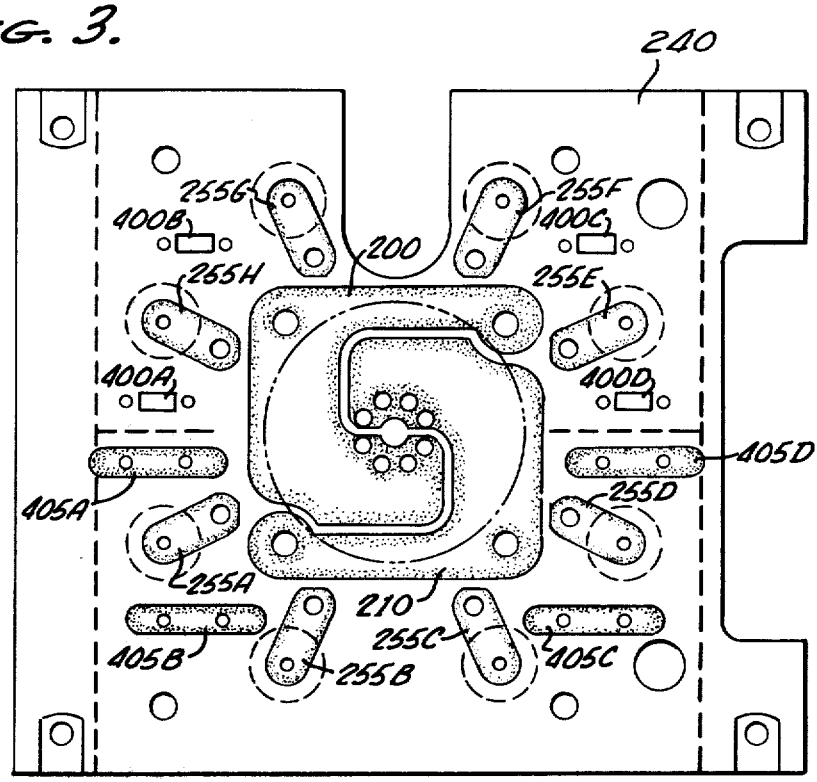
FIG. 3 is a top view of the printed circuit board shown in FIG. 2.
Figure 4:
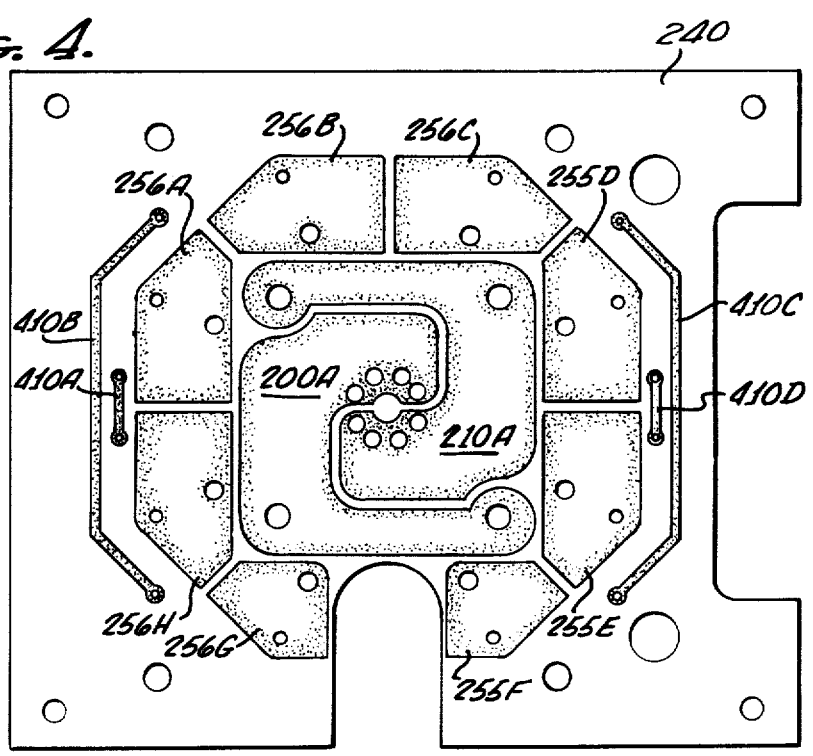
FIG. 4 is a bottom view of the printed circuit board of FIG. 3.

FIG. 3 shows a top view of the printed circuit board of FIG. 2 while FIG. 4 shows a bottom view of the printed circuit board of FIG. 2. The conductors 256A, 256B, 256C, 256D, 256E, 256F, 256G, and 256H, shown in FIG. 4, on the back face of the printed circuit board 240, are each connected respectively to the conductors 255A, 255B, 255C, 255D, 255E, 255G, and 255H on the top face of the printed circuit board 240, shown in FIG. 5. The conductors 200A and 210A, shown in FIG. 6 on the back face of the printed circuit board 240 are each connected respectively to the conductors 200 and 210, shown in FIG. 5 on the top face of the printed circuit board 240.

Referring again to the schematic circuit diagram of FIG. 1, a resistor 400A and a capacitor 405A are connected in series between the anode of the diode 120A and the cathode of the diode 120H. A similar connection is made by the resistor 400B and the capacitor 405B between the diodes 120B and 120G, by the resistor 400C and the capacitor 405C between the diodes 120C and 120F, and by the resistor 400D and the capacitor 405D between the diode 120D and 120E. These resistors and capacitors form a snubbing network. The resistors 400A, 400B, 400C, 400D and the caiacptors 405A, 405B, 405C, 405D are mounted as discrete elements on the top face of the printed circuit board 240 as shown in FIG. 3. FIG. 4 shows the conductive elements 410A, 410B, 410C, and 410D disposed on the back face of the printed circuit board 240 which connect the snubber networks. The conductors 410A completes the path between the resistor 400A and the capacitor 405A. The conductor 410B completes the path between the resistor 400B and the capacitor 405B. The conductor 410C completes the electrical path between the resistor 400C and the capacitor 405C. The conductor 410B completes the electrical path between the resistor 400D and the capacitor 405D. The connections of the snubber networks by the conductors 410A, 410B, 410C, and 410D eliminates the need for any cross-over of conductive paths and affords a completely symmetrical arrangement of the conductive paths of the snubber networks.

The Manner In Which the Output Stage Operates 120 volt, 60 cycle alternating current is imposed at a constant voltage on the input 90. The switching circuit 95 typically converts the line frequency from 60 Hertz to 20,000 Hertz. The 20,000 Hertz regulated alternating current is impressed upon the primary winding 105 of the transformer. A lower regulated voltage, typically 5 volts at 20,000 Hertz, is induced on each of the secondary windings. When the high frequency voltage applied to the primary is positive, the outer ends 246 of the secondary windings are at a positive potential with respect to the interior ends 245, the therefore the diodes 120A, 120B, 120C, and 120D will conduct, while the diodes 120E, 120F, 120G, and 120H will be reverse biased and will therefore not conduct. Thus, each of the secondary windings 110A, 110B, 110C, 110D impress a sinusoidal voltage wave form having positive potential on the heat sink 125 with respect to the heat sink 130. A current flow path is provided from the ends 2, 5 of the secondary windings 110A, 110B, 110C, 110D, respectively, through the conductors 255A, 255B, 255C, 255D, then through the diodes 120A, 120B, 120C, and 120D, respectively, and then to the heat sink 125. Current returns from the other heat sink 130 to the interior ends 245 of the windings 110A, 110B, 110C, 110D, through the conductor 200 on the printed circuit board 240.

During the negative half-cycle of the 20,000 Hertz input signal on the primary winding, the outer ends 246 of the secondary windings are at a negative potential with respect to the interior ends 245, and therefore the diodes 120A, 120B, 120C, and 120D will be reversed biased and will not conduct, whereas the diodes 120E, 120F, 120G, and 120H are forwardly biased and conduct. Therefore, the windings 110E, 110F, 110G, and 110H will impress a sinusoidal negative voltage wave form on the heat sink 130 through the diodes 120E, 120F, 120G, and 120H. A current flow path is provided from the heat sink 130 through the diodes 120E, 120F, 120G, and 120H to the conductors 255E, 255F, 255G, and 255H, respectively, and from these conductors, the current flows to the outer ends 246 of the secondary windings 110E, 110F, 110G, and 110H, flows through these windings, and returns through the inner ends 245 of these windings and through the conductor 210 to the other heat sink 125. Thus, it is seen that a full wave rectified positive potential is maintained between heat sink 125 and the heat sink 130.

This output full wave rectified wave form between the heat sink 125 and the heat sink 130 is smoothed to a substantially pure direct current by a filter network comprising the inductor 310 on the negative bus bar, the inductance of the inductor 325 on the positive bus bar, and the capacitance of the electrolytic capacitor 230 connected across the positive and negative bus bars, the inductive reactance of the elongate bus bars themselves, and the capacitance between the two closely spaced heat sinks separated by the thin insulator 275.

The four snubbing filter networks 400A, 405A; 400B, 405B; 400C, 405C; and 400D, 405D; each comprising a series connected resistor and capacitor, prevent the leakage reactance produced by the transformer from inducing high voltage spikes on the rectifier diodes 120A–120H.

Capacitor 235 across the output terminals of the output stage is sufficiently large (typically 47,000 microfarads) to store sufficient charge to maintain the output voltage for an interval of time, typically 50 milliseconds, in case of momentary failure of AC power.

A significant feature of the invention is that the multiple identical secondary windings in combination with two sets of oppositely poled diodes and packaged as described above provides several important advantages. Thus, the resistive path for each secondary winding is equal; therefore equal current loads are rectified in each diode so as to prevent an inadvertent overload situation in one or more of these diodes. Moreover, the short current paths provided by the invention insure lower power loss and decreased electrical noise. The short conductor paths also provides for improved snubbing for preventing deleterious voltage spikes on the diodes.

Thus, it is seen that an output stage for a switching regulated power supply having a step-down transformer and a full wave rectifier can be made according to the teachings of this invention to have completely uniform path lengths between the secondary windings of the transformer and the heat sinks connected to its output voltage buses with a corresponding reduction of electrical path length and minimization of power dissipation due to resistive losses. A power supply constructed in accordance with this invention supplies 1,000 watts of power and is packaged in the same size as competitive power supplies that provide only 600 to 750 watts. At the same time, ripple and noise on the DC output of the power supply is minimized to 50 millivolts peak to peak value.

What is claimed is:

1. A densely packaged output stage for a switching regulated power supply comprising:

a transformer comprising a ferromagnetic toroidal core means, a primary winding around said core means, a first plurality of secondary windings, and a second plurality of secondary windings;

a printed circuit board means mounting said core means on a top face of said board and mounting a first heat dissipation means and a second heat dissipation means on a bottom face of said board;

said secondary windings comprising substantially identical, generally U-shaped elongate conductors disposed over said core means and each having a first end and a second end;

said first end of each of said secondary windings connected to conductive elements on said printed circuit board, said conductive elements located in a plane of said printed circuit board generally interior of and surrounded by said toroidal core means;

said second end of each of said secondary windings connected to conductive elements on said printed circuit board, said conductive elements located in a plane of said printed circuit board generally outside of and surrounding said toroidal core means;

a plurality of first diode rectifying means, each of said first means having its cathode connected to said first heat dissipation means for both heat conduction thereto and electrical connection therewith and its anode connected by conductive elements on said printed circuit board to the second end of one of said first plurality of secondary windings;

a plurality of second diode rectifying means, each of said second means having its anode connected to said second heat dissipation means for both heat conduction thereto and electrical connection therewith and its cathode connected by conductive elements on said printed circuit board to the second end of one of said second plurality of secondary windings;

conductive means on said printed circuit board connecting said first end of each of said first plurality of secondary windings to said second heat sink; and conductive means on said printed circuit board connecting said first end of each of said second plurality of secondary windings to said first heat sink.

2. An output stage for a switching regulated power supply as defined in claim 1 wherein:

said second ends of said secondary windings are connected to conductive elements on said printed circuit board along the circumference of an imaginary circle surrounding and concentric with said toroidal core means; and said first ends of said secondary windings are connected to said conductive elements along the circumference of an imaginary circle surrounded by and concentric with said toroidal core means.

3. An output stage for a switching regulated power supply as defined in claim 1 wherein:

said first and second diode rectifying means are mounted along the circumference of an imaginary circle on one side of said printed circuit board, said imaginary circle concentric with said toroidal core means.

4. An output stage for a switching regulated power supply according to claims 1, 2, or 3 wherein:
said first plurality of secondary windings are located on a semi-circular portion of said toroidal core means opposite said second plurality of secondary windings, said second plurality of secondary windings located on the remaining semi-circular portion of said toroidal core means.

5. An output stage for a switching regulated power supply as defined in claims 1, 2, or 3 further comprising:
a snubbing means comprising a resistor and a capacitor connected in series by conductive elements on said printed circuit board between said first end of one of said first plurality of secondary windings and said first end of one of said second plurality of secondary windings.

6. An output stage for a switching regulated power supply as defined in claim 5 further comprising:
a plurality of said snubbing means symmetrically located on said printed circuit board, said board providing a plurality of symmetrical electrical paths between said plural snubber means and said first and second pluralities of secondary windings.

7. An output stage for a switching regulated power supply according to claim 1, 2, or 3 wherein:
said first and second heat dissipation means are mounted in mutually parallel coplanar relationship on said bottom face of said printed circuit board with a small insulated gap therebetween.

8. An output stage for a switching regulated power supply according to claims 1, 2, or 3 further comprising:
conductive bus bar means extending the length of said printed circuit board disposed adjacent said printed circuit board, said bus bar means comprising a positive bus bar means connecting said first heat sink to a positive output terminal of said power supply and a negative bus bar means connecting said second heat sink to a negative output terminal of said power supply.

9. An output stage for a switching regulated power supply as defined in claim 8 wherein:
said bus bar means includes an inductive reactance for filtering a voltage wave form between said positive and negative output terminals.

10. An output stage for a switching regulated power supply according to claim 8 further comprising:
filtering means, including a capacitor mounted on and connecting said positive bus bar and said negative bus bar.

11. An output stage for a switching regulated power supply according to claim 8 further comprising:
filtering means including an inductor means mounted on at least one of said positive and negative bus bars.

12. An output stage for a switching regulated power supply according to claim 11 wherein:
said inductor means substantially but not entirely encircle a portion of the bus bar or bars upon which said means are mounted.

13. An output stage for a switching regulated power supply according to claims 1, 2, or 3 including a capacitor electrically connected between said heat dissipation means for maintaining the DC output voltage for an interval of time in case of momentary failure of AC power.

14. A full wave rectifier comprising:
a transformer core means having a primary winding and a plurality of secondary windings disposed adjacent said transformer core means;
a first and second heat sink disposed adjacent one another in parallel coplanar relationship and axially adjacent said toroidal core means;
a plurality of diode rectifying means mounted on said first heat sink, a cathode of each of said plurality of diode rectifying means connected to said first heat sink, and an anode thereof connected to one of said plurality of secondary windings;
a plurality of diode rectifying means mounted on said second heat sink, an anode of each of said plurality of diode rectifying means connected to said first heat sink, and a cathode thereof connected to one of said plurality of secondary windings; and
a plurality of electrical paths, each of said electrical paths comprising one of said secondary windings and one of said diode means connected thereto, all of said electrical paths having substantially the same length and electrical resistance.

15. A full wave rectifier as defined in claim 14 wherein:
said transformer core means has a circular configuration;
said plurality of diode means are located along the circumference of an imaginary circle concentric with said circular configuration of said transformer core means; and
said plurality of diode means are connected to said plurality of secondary windings at connections disposed along the circumference of an imaginary circle concentric with said circular configuration of said transformer core means.

16. A full wave rectifier according to claims 14 or 15 further comprising:
a plurality of resistive and capacitive snubber means, each of said means connected in series between a diode mounted on said first heat sink and a diode mounted on said second heat sink, said plurality of snubber means connected by conductive elements arranged symmetrically with respect to said plurality of secondary windings.

17. A full wave rectifier according to claims 14 or 15 wherein:
said first and second heat sinks are mounted in mutually parallel coplanar relationship and are separated from one another by an insulated gap providing some capacitive filter smoothing of the rectified electrical voltage output between said first and second heat sinks.

18. A full wave rectifier according to claims 14 or 15 further comprising:
bus bar means conducting electric power from said first and second heat sinks to a positive and a negative output terminal respectively, said bus bar means smoothing an electrical voltage output of said first and second heat sinks.

19. A full wave rectifier as defined in claim 18 further comprising:
filtering means comprising: a capacitor means connected between said
positive and said negative output terminals; and inductor means mounted on said bus bar means.

20. A full wave rectifier comprising:
a plurality of secondary windings of a transformer connected to a plurality of forward mounted diodes on a first heat sink and a plurality of secondary windings of said transformer connected to reverse mounted diodes on a second heat sink, the electrical paths provided by each of said plurality of secondary windings and associated diodes having substantially equal electrical impedance for all of said plurality of secondary windings.

21. A full wave rectifier comprising:
a plurality of power diodes for rectifying AC power to DC power; and
an equal plurality of means for respectively supplying AC power to said power diodes, each of such means comprising a single turn secondary winding connected to a respective one of said diodes, said windings being substantially identical in construction and electrical impedance, those of said power diodes which rectify the positive half-cycles being mounted on a first heat sink and those of said power diodes which rectify the negative half-cycles being mounted on a second heat sink.

22. A full wave rectifier according to claim 14, wherein:
said plurality of secondary windings each comprise a single turn winding connected to a respective one of said diode rectifying means, said windings being substantially identical in construction and electrical impedance.

23. A full wave rectifier according to claim 20, wherein:
said plurality of secondary windings each comprise a single turn winding connected to a respective one of said forward and reverse mounted diodes, said windings being substantially identical in construction and electrical impedance.

24. An output stage for a switching regulated power supply according to claim 9 further comprising:
filtering means, including a capacitor mounted on and connecting said positive bus bar and said negative bus bar.

25. An output stage for a switching regulated power supply according to claim 9 further comprising:
filtering means, including an inductor means mounted on at least one of said positive and negative bus bars.

26. An output stage for a switching regulated power supply according to claim 25 wherein:
said inductor means substantially but not entirely encircle a portion of the bus bar or bars upon which said means are mounted.

27. A densely packaged full wave rectifier output comprising:
a transformer comprising a ferromagnetic core, a primary winding around said core, and a plurality of secondary windings disposed around said core,
a first heat sink and a second heat sink disposed adjacent one another in parallel co-planar relationship and axially adjacent said toroidal core means,
a plurality of diodes arranged proximate to and around the periphery of said transformer and each being respectively electrically connected to one of said secondary windings, those of said diodes which rectify the positive half-cycles being mounted on said first heat sink and those of said diodes which rectify the negative half-cycles being mounted on said second heat sink.

* * * * *